United States Patent
Igarashi et al.

(10) Patent No.: US 7,651,631 B2
(45) Date of Patent: Jan. 26, 2010

(54) PHOSPHOR, OPTICAL DEVICE, AND DISPLAY DEVICE

(75) Inventors: Takahiro Igarashi, Kanagawa (JP); Tsuneo Kusunoki, Kanagawa (JP); Katsutoshi Ohno, Tokyo (JP); Isamu Kobori, Tokyo (JP)

(73) Assignee: Sony Corporation, Tokyo (JP)

( * ) Notice: Subject to any disclaimer, the term of this patent is extended or adjusted under 35 U.S.C. 154(b) by 245 days.

(21) Appl. No.: 11/460,536

(22) Filed: Jul. 27, 2006

(65) Prior Publication Data
US 2007/0023734 A1 Feb. 1, 2007

(30) Foreign Application Priority Data
Jul. 28, 2005 (JP) ............................. 2005-219331
Dec. 14, 2005 (JP) ............................. 2005-360795

(51) Int. Cl.
C09K 11/56 (2006.01)
C09K 11/55 (2006.01)
C09K 11/62 (2006.01)
C09K 11/64 (2006.01)

(52) U.S. Cl. .............................. 252/301.4 S; 313/503; 313/504; 313/486; 313/487

(58) Field of Classification Search ........... 252/301.4 S; 313/503, 486, 487, 504
See application file for complete search history.

(56) References Cited

U.S. PATENT DOCUMENTS

| | | | | |
|---|---|---|---|---|
| 3,639,254 A * | 2/1972 | Peters | ................... | 252/301.4 S |
| 3,801,702 A * | 4/1974 | Donohue | .................... | 423/263 |
| 6,074,575 A * | 6/2000 | Sugioka et al. | ....... | 252/301.4 S |
| 6,180,073 B1 * | 1/2001 | Huguenin et al. | ........... | 423/155 |
| 6,252,254 B1 * | 6/2001 | Soules et al. | .................. | 257/89 |
| 6,417,019 B1 * | 7/2002 | Mueller et al. | ................. | 438/29 |
| 6,544,438 B2 * | 4/2003 | Yocom et al. | ......... | 252/301.4 S |
| 6,637,905 B1 * | 10/2003 | Ng et al. | ..................... | 362/601 |
| 6,695,982 B2 * | 2/2004 | Ellens et al. | .......... | 252/301.4 S |
| 6,723,455 B2 * | 4/2004 | Ueda et al. | ................... | 428/690 |
| 6,773,629 B2 | 8/2004 | Le Mercier et al. | | |
| 6,850,002 B2 | 2/2005 | Danielson et al. | | |
| 7,018,565 B2 * | 3/2006 | Tian et al. | ............. | 252/301.4 S |

(Continued)

FOREIGN PATENT DOCUMENTS

EP 1403355 3/2004

(Continued)

OTHER PUBLICATIONS

Defintion of "chemical formula" from Hawley's Condensed Chemical dictionary, 14th edition, 2002/.*

(Continued)

Primary Examiner—C. Melissa Koslow
(74) Attorney, Agent, or Firm—K&L Gates LLP

(57) ABSTRACT

A phosphor, an optical device, and a display device are provided. The phosphor includes a composition represented by $(Sr_{(1-x-y)}Ca_xBa_y)(Ga_{(1-m-n)}Al_mIn_n)_aS_4:Eu$, wherein the concentration of europium is in the range of 1 to 9 mole percent; $0 \leq x \leq 1$, $0 \leq y \leq 1$, and $x+y \leq 1$; $0 \leq m \leq 1$, $0 \leq n \leq 1$, $m+n \leq 1$, and $2.9 \leq a \leq 5.9$; and a main absorption wavelength range of the excitation is selected either a first wavelength range that overlaps the entirety of a reference wavelength range and extends to the shorter wavelength side or a second wavelength range that overlaps the entirety of the reference wavelength range and extends to the longer wavelength side according to the value a.

11 Claims, 9 Drawing Sheets

U.S. PATENT DOCUMENTS 7,368,179 B2    5/2008    Tian et al.

FOREIGN PATENT DOCUMENTS

| FR | 2826016 | 12/2002 |
|---|---|---|
| JP | 47-038745 | 9/1972 |
| JP | 53-061964 | 6/1978 |
| JP | 2002-151268 | 5/2002 |
| JP | 2004-505172 | 2/2004 |
| JP | 2004-529261 | 9/2004 |
| JP | 2006-524437 | 10/2006 |
| WO | 02/23957 | 3/2002 |
| WO | 2005/026285 | 3/2005 |

OTHER PUBLICATIONS

Phophor Research Society Meeting technical digest, p. 28.
Chartier, C. et al., "Electroluminescence of Eu2+ in SrGa2S4," Journal of Luminescence, vol. 111, pp. 147-158, 2005.
Hu, Yunsheng et al., "Preparation and luminescent properties of (Ca1-x, Srx)S:Eu2+ red-emitting phosphor for white LED," Journal of Luminescence, vol. 111, pp. 139-145, 2005.
Chartier, C. et al., "Photoluminescence of Eu2+ in SrGa2S4," Journal of Luminescence, vol. 111, pp. 147-159, 2005.
Davolos, M.R. et al., "Luminescence of Eu2+ in Strontium and Barium Thiogallates," Journal of Solid State Chemistry, vol. 83, pp. 316-323, 1989.
Japanese Office Action issued on Jan. 20, 2009, for corresponding Japanese Patent Application JP 2005-360795.

* cited by examiner

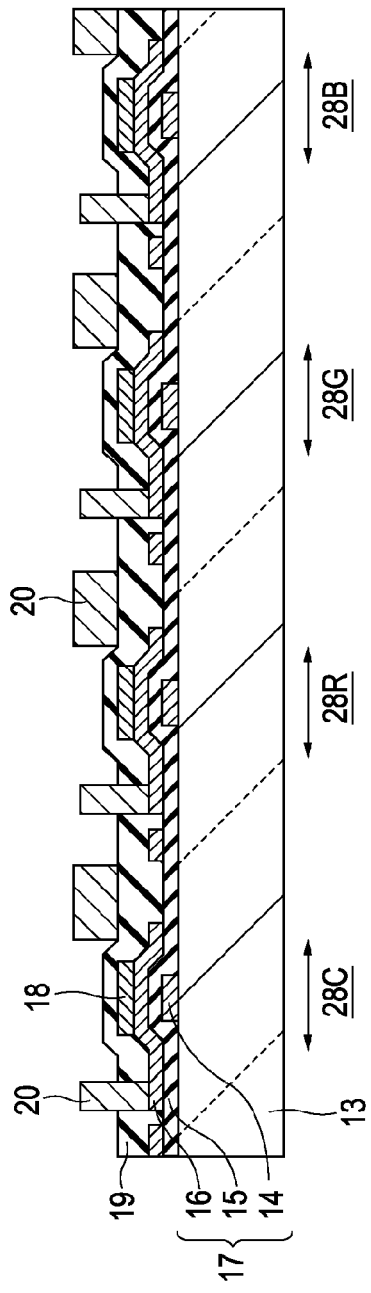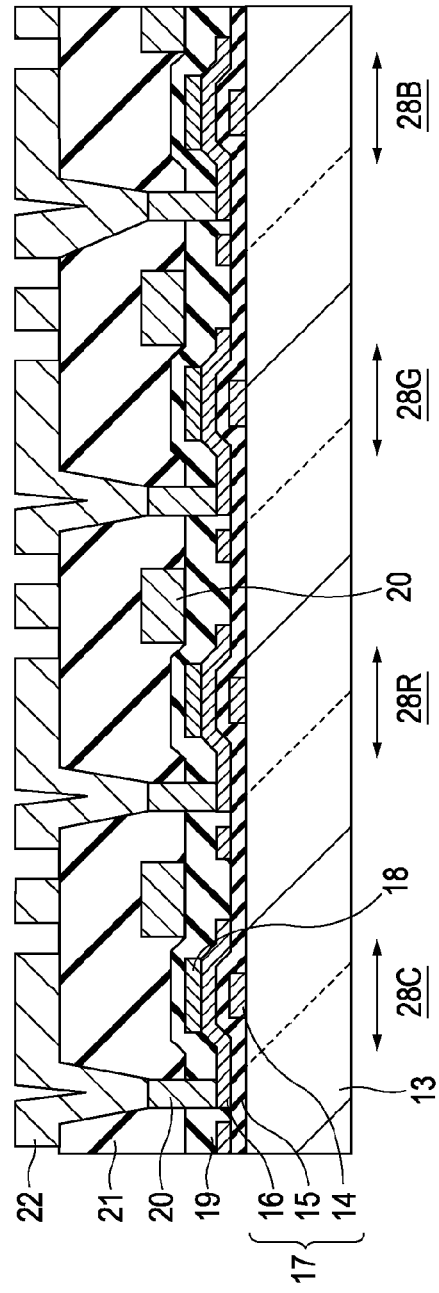

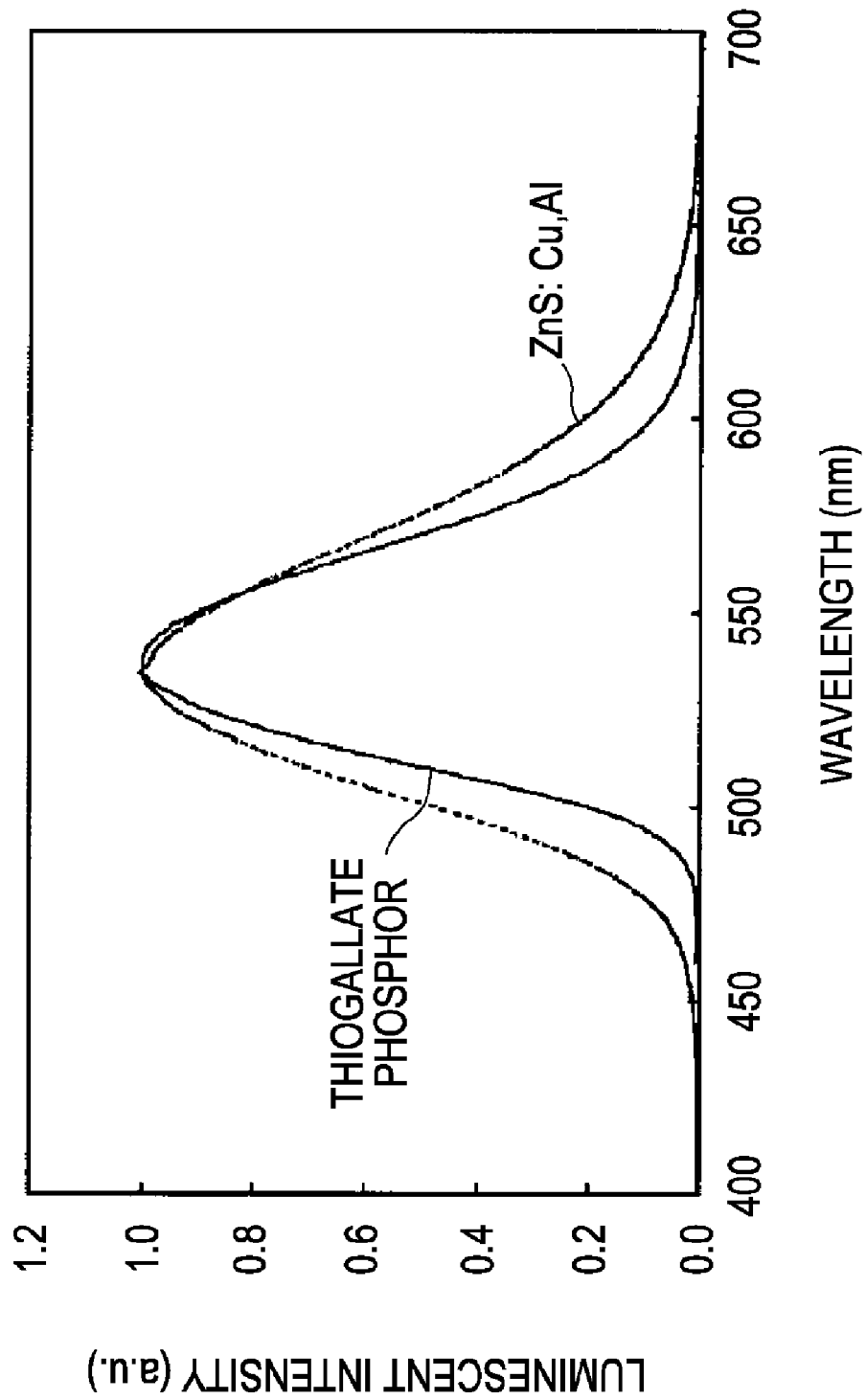

PHOSPHOR, OPTICAL DEVICE, AND DISPLAY DEVICE

CROSS REFERENCES TO RELATED APPLICATIONS

The present application relates to Japanese Patent Application JP 2005-219331 filed in the Japanese Patent Office on Jul. 28, 2005, and Japanese Patent Application JP 2005-360795 filed in the Japanese Patent Office on Dec. 14, 2005, the entire contents of which are incorporated herein by reference.

BACKGROUND

The present invention generally relates to a phosphor, an optical device including the phosphor, and a display device including the phosphor.

A phosphor represented by chemical formula 4:

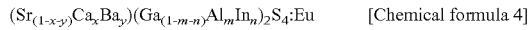  [Chemical formula 4]

known as a thiogallate phosphor has a spectrum width in the green light region smaller than that of a phosphor (ZnS: Cu, Al) used in an electron-beam-excitation light-emission device, such as a cathode-ray tube, and thus, has a satisfactory color purity, as shown in FIG. 10 showing the relationship between the wavelength and the luminescent intensity (for example, see Journal of Luminescence Vol. 111, pp. 147-158, (2005)).

In general, as the emission center wavelength approaches the wavelength at which the luminous efficacy is the maximum in the color region and as the width of the spectrum increases, the luminance of the phosphor increases. Therefore, the luminance of the thiogallate phosphor depends on whether the spectrum center is close to a wavelength of 555 nm at which the luminous efficacy is the maximum or not, and the width of the spectrum.

However, for example, as is apparent from the fact that the emission spectrum of pure green light has a center wavelength of about 520 nm and a small width, a phosphor having satisfactory color purity inevitably tends to have a low luminance. For example, it is known that the fluorescent luminance obtained by electron beam excitation of the thiogallate phosphor is lower than that of the ZnS:Cu, Al phosphor by about 23%.

On the other hand, in display devices including organic electroluminescence (EL) elements, which have recently attracted attention, a structure combining a blue luminescent layer with a color conversion layer has been studied. In the known display devices, since the durability of an organic dye constituting the color conversion layer is not satisfactory, the efficiency of the color conversion markedly decreases (with time) with continued use of the device.

To overcome this problem, a method of using a color conversion layer including an inorganic phosphor having a high durability has been proposed (for example, see Japanese Unexamined Patent Application Publication No. 2002-151268). According to this technique, the above-described degradation with time can be suppressed by using an inorganic phosphor as the color conversion layer. However, even this structure still has an insufficient luminance.

The low luminance is disadvantageous not only in optical devices, such as an illuminator, but also display devices that include a phosphor, and thus an improvement in the luminance is desired.

In general, there is a certain tendency in the absorption wavelength range of a phosphor, and the wavelength of the irradiating light for exciting the phosphor is selected according to the absorption wavelength range. However, in some display devices, not only the emission from the phosphor but also the above irradiating light itself is used for a part of the pixels. Thus, the selection of the irradiating light has also been restricted.

SUMMARY

In view of the above situation, it is desirable to provide a phosphor that has both a high color purity and an improved luminance and that is excited by the irradiation of light having a desired wavelength range, and an optical device and a display device that include the phosphor.

A phosphor according to an embodiment of the present invention includes a composition represented by chemical formula 5:

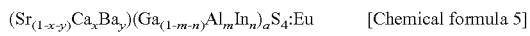  [Chemical formula 5]

wherein the concentration of europium (Eu) is in the range of 1 to 9 mole percent; $0 \leq x \leq 1$, $0 \leq y \leq 1$, and $x+y \leq 1$; $0 \leq m \leq 1$, $0 \leq n \leq 1$, and $m+n \leq 1$; and a main absorption wavelength range of the excitation is either a first wavelength range that overlaps the entirety of a reference wavelength range and extends to the shorter wavelength side or a second wavelength range that overlaps the entirety of the reference wavelength range and extends to the longer wavelength side according to value a.

An optical device according to an embodiment of the present invention includes at least a phosphor having a composition represented by chemical formula 6:

  [Chemical formula 6]

wherein the concentration of Eu is in the range of 1 to 9 mole percent; $0 \leq x \leq$, $0 \leq y \leq 1$, and $x+y \leq 1$; $0 \leq m < 1$, $0 \leq n < 1$, and $m+n < 1$; and a is about 2; and an excess of one or more of Ga, Al and In, wherein a total amount of Ga, Al and In includes the Ga, Al and In in the composition and the excess of Ga, Al and In, and a ratio of the total amount of Ga, Al and In to a total amount of (Sr+Ca+Ba) in the composition ranges from 2.8 to 5.9.

An optical device according to an embodiment of the present invention includes at least a phosphor having a composition represented by chemical formula 7:

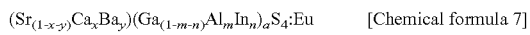  [Chemical formula 7]

wherein the concentration of Eu is in the range of 1 to 9 mole percent; $0 \leq x \leq 1$, $0 \leq y \leq 1$, and $x+y \leq 1$; $0 \leq m \leq 1$, $0 \leq n \leq 1$, and $m+n \leq 1$; and $1.9 \leq a \leq 2.3$.

A display device according to an embodiment of the present invention includes a plurality of pixels, and an organic EL element, wherein color conversion layers that convert light emitted from the organic EL element to light having a predetermined wavelength range are provided on at least a part of the pixels, and at least one of the color conversion layers includes a phosphor having a composition represented by chemical formula 5, in chemical formula 5, the concentration of Eu is in the range of 1 to 9 mole percent; $0 \leq x \leq 1$, $0 \leq y \leq 1$, and $x+y \leq 1$; $0 \leq m \leq 1$, $0 \leq n \leq 1$, and $m+n \leq 1$; and a main absorption wavelength range of the excitation is either a first wavelength range that overlaps the entirety of a reference wavelength range and extends to the shorter wavelength side or a second wavelength range that overlaps the entirety of the reference wavelength range and extends to the longer wavelength side according to the value a.

According to a phosphor of an embodiment of the present invention, in a phosphor having a composition represented by chemical formula 5, the concentration of Eu is in the range of 1 to 9 mole percent, and a main absorption wavelength range of the excitation is either a first wavelength range that overlaps the entirety of a reference wavelength range and extends to the shorter wavelength side or a second wavelength range that overlaps the entirety of the reference wavelength range and extends to the longer wavelength side according to value a. Therefore, by adjusting the stoichiometry of Ga, irradiating light having a desired wavelength range is selected and the excitation can be caused.

According to an optical device of an embodiment of the present invention, in an optical device including at least a phosphor having a composition represented by chemical formula 6, the concentration of Eu is in the range of 1 to 9 mole percent; $0 \leq x \leq 1$, $0 \leq y \leq 1$, and $x+y \leq 1$; $0 \leq m < 1$, $0 \leq n < 1$, and $m+n < 1$, and a is about 2; and an excess of one or more of Ga, Al and In, wherein a total amount of Ga, Al and In includes the Ga, Al and In in the composition and the excess of Ga, Al and In, and a ratio of the total amount of Ga, Al and In to a total amount of (Sr+Ca+Ba) in the composition ranges from 2.8 to 5.9. Consequently, a structure including a phosphor having an improved luminance while maintaining a high color purity can be provided, thereby increasing the efficiency of the emission device.

According to an optical device of an embodiment of the present invention, in an optical device including at least a phosphor having a composition represented by chemical formula 7, the concentration of Eu is in the range of 1 to 9 mole percent; $0 \leq x \leq 1$, $0 \leq y \leq 1$, and $x+y \leq 1$; $0 \leq m \leq 1$, $0 \leq n \leq 1$, and $m+n \leq 1$; and $1.9 \leq a \leq 2.3$. Consequently, a structure including a phosphor having an improved luminance while maintaining a high color purity can be provided, thereby increasing the efficiency of the emission device.

According to a display device of an embodiment of the present invention, color conversion layers that convert light emitted from an organic EL element to light having a predetermined wavelength range are provided on at least a part of pixels, and at least one of the color conversion layers includes a phosphor having a composition represented by chemical formula 5, in chemical formula 5, the concentration of Eu is in the range of 1 to 9 mole percent; $0 \leq x \leq 1$, $0 \leq y \leq 1$, and $x+y \leq 1$; $0 \leq m \leq 1$, $0 \leq n \leq 1$, and $m+n \leq 1$; and a main absorption wavelength range of the excitation is either a first wavelength range that overlaps the entirety of a reference wavelength range and extends to the shorter wavelength side or a second wavelength range that overlaps the entirety of the reference wavelength range and extends to the longer wavelength side according to value a. Consequently, the luminance of light output from the color conversion layer including the inorganic phosphor having a high durability can be improved.

Additional features and advantages are described herein, and will be apparent from, the following Detailed Description and the figures.

BRIEF DESCRIPTION OF THE FIGURES

FIGS. 8A and 8B are views showing steps of producing a display device according to an embodiment of the present invention.

FIG. 10 is a spectral diagram for explaining a thiogallate phosphor.

DETAILED DESCRIPTION

Figure 1:
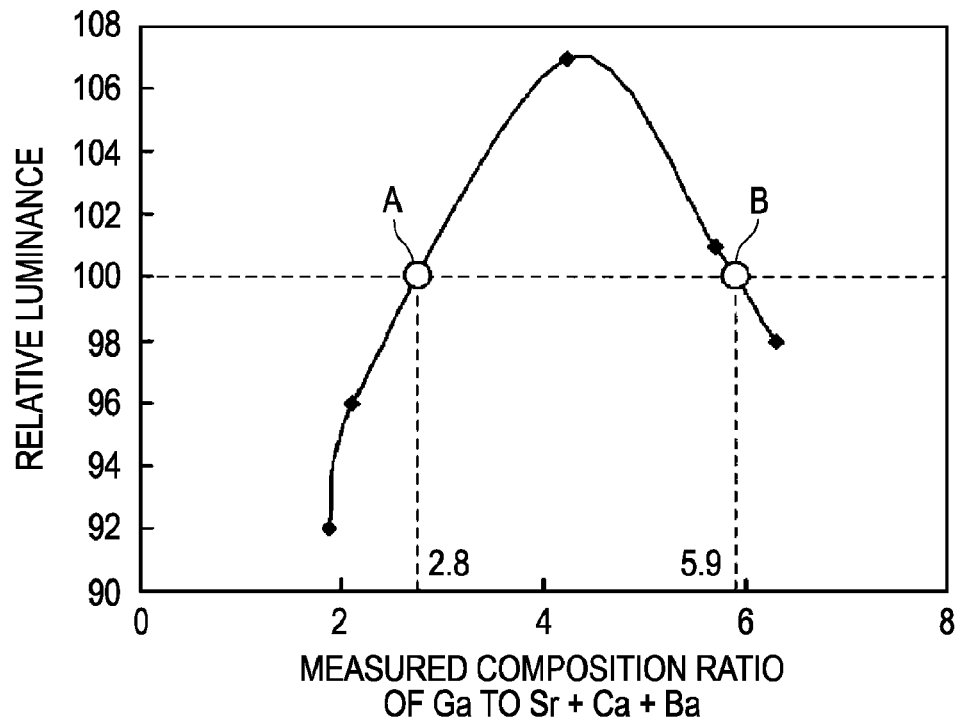
FIG. 1 is a graph showing the relationship between the composition ratio and the relative luminance in an example of a phosphor according to an embodiment of the present invention.

Embodiments of the present invention will now be described with reference to the drawings.

A phosphor according to an embodiment of the present invention will be described.

First, a method of synthesizing phosphors of the present embodiment will be described. In this embodiment, strontium carbonate ($SrCO_3$), barium carbonate ($BaCO_3$), and calcium carbonate ($CaCO_3$) were used as raw materials of strontium (Sr), barium (Ba), and calcium (Ca), respectively, which constitute a final phosphor. Alternatively, sulfates, sulfides, chlorides, or the like may be used without problem. Gallium oxide ($Ga_2O_3$) was used as the raw material of gallium (Ga). Alternatively, a sulfate, a sulfide, a chloride, or the like may be used without problem. Europium oxide ($Eu_2O_3$) was used as the raw material of europium (Eu). Alternatively, a sulfate, a sulfide, a chloride, or the like may be used without problem.

First, the above-described raw materials were mixed in the composition ratio of (Sr+Ca+Ba:Ga)=1:2 to 1:4. This mixture is formulated again, and a formulation serving as a precursor of a final sample was prepared within the range that satisfied $0 \leq x \leq 1$, $0 \leq y \leq 1$, and $0 \leq x+y \leq 1$ in the composition represented by chemical formula 8.

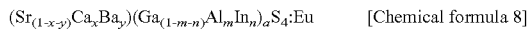

$(Sr_{(1-x-y)}Ca_xBa_y)(Ga_{(1-m-n)}Al_mIn_n)_aS_4:Eu$      [Chemical formula 8]

The composition of Sr, Ca, and Ba in chemical formula 8 was selected according to the composition of the final sample. Europium was sequentially added so that the concentration was in the range of 1 to 9 mole percent. In this embodiment, an example in which the Eu concentration is 6 mole percent will be described.

The total weight of the formulation was then controlled to 20 g and the formulation was transferred to a 500-mL plastic container. Subsequently, 200 mL of ethanol and 100 g of alumina balls each having a diameter of 5 mm were added thereto, and rotation ball milling (mixing) was performed for three hours. After the ball milling, filtration was performed. The filtered residue, which was a precursor of the final sample, was dried in air at 50° C. for two hours. After drying, the residue was ground with an alumina mortar to prepare an intermediate.

The intermediate was then placed in a quartz tube. The intermediate was fired at an arbitrary temperature in the range of 800° C. to 1,000° C. while hydrogen sulfide gas was supplied at a rate of 10 to 1,000 mL/min. The flow rate of the hydrogen sulfide gas depends on the amount of intermediate to be fired. However, preferably, the gas is sufficiently supplied relative to a flow rate that is theoretically determined from the amount of intermediate. For example, when the amount of intermediate fired is about several grams, the flow rate is preferably about 100 mL/min. The optimum firing temperature was 930° C. Thus, phosphor samples according to this embodiment were prepared.

In this embodiment, since aluminum (Al) and indium (In) are not used as the raw materials, $m=n=0$ in chemical formula 8. When Al and In are used as the raw materials, these elements are appropriately introduced within the range that satisfies $0 \leq m \leq 1$, $0 \leq n \leq 1$, and $0 \leq m+n \leq 1$. In such a case, regarding the emission spectrum of the final phosphor, the position and the width of the peak can be adjusted in the center wavelength range of 500 to 560 nm.

The samples thus prepared were analyzed by inductively coupled plasma-atomic emission spectrometry (ICP-AES).

As Example 1, the results of an examination of fluorescence of samples each having a composition represented by chemical formula 9 in which visible light (center wavelength: 450 nm) or ultraviolet light (center wavelength: 350 nm) is used as the excitation light will be described with reference to Tables 1 and 2. That is, this is an example in which $x=y=0$ and $m=n=0$ in the composition represented by chemical formula 8.

$$SrGa_aS_4{:}Eu \qquad \text{[Chemical formula 9]}$$

In Example 1, when visible light was used as the excitation light of the phosphors, as shown in Table 1, as the stoichiometric ratio (Ga/Sr) of Ga to Sr in the preparation of the formulation (i.e., in the raw material) increased, the measured composition ratio of Ga/Sr in the sample also tended to increase. However, regarding the luminescent intensity (luminance) ratio, only the luminance of samples 3 and 4 wherein the measured composition ratios corresponding to value a in chemical formula 9 were 4.23 and 5.71, respectively, was equal to or larger than that of Comparative Examples 1 to 3, which had a known composition ($SrGa_2S_4{:}Eu$).

TABLE 1

|  | Sample 1 | Sample 2 | Sample 3 | Sample 4 | Sample 5 | Comparative Example 1 | Comparative Example 2 | Comparative Example 3 |
| --- | --- | --- | --- | --- | --- | --- | --- | --- |
| Ga/Sr in formulation (Stoichiometric ratio) | 0.8 | 1 | 2 | 3 | 4 | — | — | — |
| Ga/Sr in sample (Measured ratio) | 1.87 | 2.12 | 4.23 | 5.71 | 6.31 | 2.27 | 1.85 | 1.83 |
| Luminescent intensity ratio (%) | 92% | 96% | 107% | 101% | 98% | 100% | 92% | 92% |

In Example 1, when ultraviolet light was used as the excitation light of the phosphors, as shown in Table 2, as the stoichiometric ratio (Ga/Sr) of Ga to Sr in the preparation of the formulation (i.e., in the raw material) increased, the measured composition ratio of Ga/Sr in the sample also tended to increase. However, regarding the luminescent intensity (luminance) ratio, only the luminance of samples 1 and 2 wherein the measured composition ratios corresponding to value a in chemical formula 9 were 1.87 and 2.12, respectively, was equal to or larger than that of Comparative Examples 1 to 3, which had a known composition ($SrGa_2S_4{:}Eu$).

TABLE 2

|  | Sample 1 | Sample 2 | Sample 3 | Sample 4 | Sample 5 | Comparative Example 1 | Comparative Example 2 | Comparative Example 3 |
| --- | --- | --- | --- | --- | --- | --- | --- | --- |
| Ga/Sr in formulation (Stoichiometric ratio) | 0.8 | 1 | 2 | 3 | 4 | — | — | — |
| Ga/Sr in sample (Measured ratio) | 1.87 | 2.12 | 4.23 | 5.71 | 6.31 | 2.27 | 1.85 | 1.83 |

TABLE 2-continued

|  | Sample 1 | Sample 2 | Sample 3 | Sample 4 | Sample 5 | Comparative Example 1 | Comparative Example 2 | Comparative Example 3 |
|---|---|---|---|---|---|---|---|---|
| Luminescent intensity ratio (%) | 100% | 105% | 60% | 55% | 50% | 65% | 100% | 100% |

As Example 2, the results of an examination of fluorescence of samples each having a composition represented by chemical formula 10 in which visible light (center wavelength: 450 nm) or ultraviolet light (center wavelength: 350 nm) is used as the excitation light will be described with reference to Tables 3 and 4. That is, this is an example in which x=0, y=0.5, and m=n=0 in the composition represented by chemical formula 8.

$$Sr_{0.5}Ba_{0.5}Ga_aS_4:Eu \qquad \text{[Chemical formula 10]}$$

In the system containing barium, the emission wavelength is shifted to the shorter wavelength side compared with that of the system containing only strontium. The purpose of the addition of barium as a solid solution is to adjust the chromaticity, and thus a green luminescent color can be changed to some degree. By controlling the amount of barium contained in the form of a solid solution, the emission wavelength can be changed in the range of 501 to 558 nm.

In Example 2, when visible light was used as the excitation light of the phosphors, as shown in Table 3, as the stoichiometric ratio (Ga/(Sr+Ba)) of Ga to Sr+Ba in the preparation of the formulation (i.e., in the raw material) increased, the measured composition ratio of Ga/(Sr+Ba) in the sample also tended to increase. However, regarding the luminescent intensity (luminance) ratio, only the luminance of samples 2, 3, and 4 wherein the measured composition ratios corresponding to value a in chemical formula 10 and an excess of Ga were 2.02, 4.11, and 5.50, respectively, was equal to or larger than that of Comparative Examples 1 to 3.

TABLE 3

|  | Sample 1 | Sample 2 | Sample 3 | Sample 4 | Sample 5 |
|---|---|---|---|---|---|
| Ga/(Sr + Ba) in formulation (Stoichiometric ratio) | 0.8 | 1 | 2 | 3 | 4 |
| Ga/(Sr + Ba) in sample (Measured ratio) | 1.83 | 2.02 | 4.11 | 5.50 | 6.11 |
| Luminescent intensity ratio (%) | 96% | 100% | 115% | 106% | 98% |

In Example 2, when ultraviolet light was used as the excitation light of the phosphors, as shown in Table 4, as the stoichiometric ratio (Ga/(Sr+Ba)) of Ga to Sr+Ba in the preparation of the formulation (i.e., in the raw material) increased, the measured composition ratio of Ga/(Sr+Ba) in the sample also tended to increase. However, regarding the luminescent intensity (luminance) ratio, only the luminance of sample 2 wherein the measured composition ratio corresponding to value a in chemical formula 10 was 2.02 was equal to or larger than that of Comparative Examples 1 to 3.

TABLE 4

|  | Sample 1 | Sample 2 | Sample 3 | Sample 4 | Sample 5 |
|---|---|---|---|---|---|
| Ga/(Sr + Ba) in formulation (Stoichiometric ratio) | 0.8 | 1 | 2 | 3 | 4 |
| Ga/(Sr + Ba) in sample (Measured ratio) | 1.83 | 2.02 | 4.11 | 5.50 | 6.11 |
| Luminescent intensity ratio (%) | 96% | 110% | 65% | 62% | 57% |

As Example 3, the results of an examination of fluorescence of samples each having a composition represented by chemical formula 11 in which visible light (center wavelength: 450 nm) or ultraviolet light (center wavelength: 350 nm) is used as the excitation light will be described with reference to Tables 5 and 6. That is, this is an example in which x=0.5, y=0, and m=n=0 in the composition represented by chemical formula 8.

$$Sr_{0.5}Ca_{0.5}Ga_3S_4:Eu \qquad \text{[Chemical formula 11]}$$

In the system containing calcium, the emission wavelength is shifted to the longer wavelength side compared with that of the system containing only strontium. The purpose of the addition of calcium as a solid solution is to adjust the chromaticity, and thus a green luminescent color can be changed to some degree. By controlling the amount of calcium contained in the form of a solid solution, the emission wavelength can be changed in the range of 501 to 558 nm.

In Example 3, when visible light was used as the excitation light of the phosphors, as shown in Table 5, as the stoichiometric ratio (Ga/(Sr+Ca)) of Ga to Sr+Ca in the preparation of the formulation (i.e., in the raw material) increased, the measured composition ratio of Ga/(Sr+Ca) in the sample also tended to increase. However, regarding the luminescent intensity (luminance) ratio, only the luminance of samples 2, 3, and 4 wherein the measured composition ratios corresponding to value a in chemical formula 11 and an excess of Ga was 2.08, 4.31, and 5.52, respectively, were equal to or larger than that of Comparative Examples 1 to 3.

TABLE 5

|  | Sample 1 | Sample 2 | Sample 3 | Sample 4 | Sample 5 |
|---|---|---|---|---|---|
| Ga/(Sr + Ba) in formulation (Stoichiometric ratio) | 0.8 | 1 | 2 | 3 | 4 |
| Ga/(Sr + Ca) in sample (Measured ratio) | 1.88 | 2.08 | 4.31 | 5.52 | 6.23 |
| Luminescent intensity ratio (%) | 97% | 100% | 117% | 106% | 98% |

In Example 3, when ultraviolet light was used as the excitation light of the phosphors, as shown in Table 6, as the stoichiometric ratio (Ga/(Sr+Ca)) of Ga to Sr+Ca in the preparation of the formulation (i.e., in the raw material) increased, the measured composition ratio of Ga/(Sr+Ca) in the sample also tended to increase. However, regarding the luminescent intensity (luminance) ratio, only the luminance of sample 2 wherein the measured composition ratio corresponding to value a in chemical formula 11 was 2.08 was equal to or larger than that of Comparative Examples 1 to 3.

TABLE 6

|  | Sample 1 | Sample 2 | Sample 3 | Sample 4 | Sample 5 |
|---|---|---|---|---|---|
| Ga/(Sr + Ba) in formulation (Stoichiometric ratio) | 0.8 | 1 | 2 | 3 | 4 |
| Ga/(Sr + Ca) in sample (Measured ratio) | 1.88 | 2.08 | 4.31 | 5.52 | 6.23 |
| Luminescent intensity ratio (%) | 97% | 112% | 65% | 61% | 60% |

Figure 2:
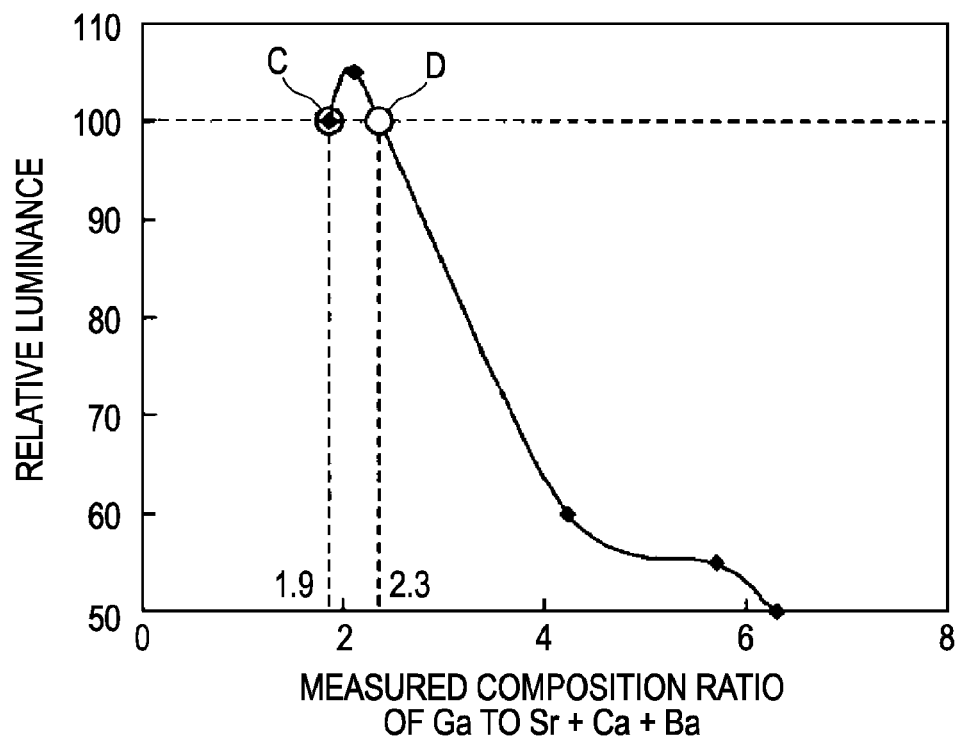
FIG. 2 is a graph showing the relationship between the composition ratio and the relative luminance in an example of the phosphor according to an embodiment of the present invention.

On the basis of the results of Examples 1 to 3, the relationship between the measured composition ratio ($Sr_{(1-x-y)}Ca_xBa_y/Ga$) of the total of the elements of $Sr_{(1-x-y)}Ca_xBa_y$ part (Sr–Ca–Ba site) to Ga and the relative luminance was examined. Referring to the examination results shown in FIG. 1, it is believed that when visible light is used as the excitation light, a luminance relatively higher than that of the above comparative examples, i.e., known examples, can be achieved in the range of 2.8 (point A in the figure) to 5.9 (point B in the figure) of the measured composition ratio. The optimum value of the measured composition ratio was 4.23. On the other hand, referring to the examination results shown in FIG. 2, it is believed that when ultraviolet light is used as the excitation light, a luminance relatively higher than that of the above comparative examples, i.e., known examples, can be achieved in the range of 1.9 (point C in the figure) to 2.3 (point D in the figure) of the measured composition ratio. The optimum value of the measured composition ratio was 2.10.

Figure 3:
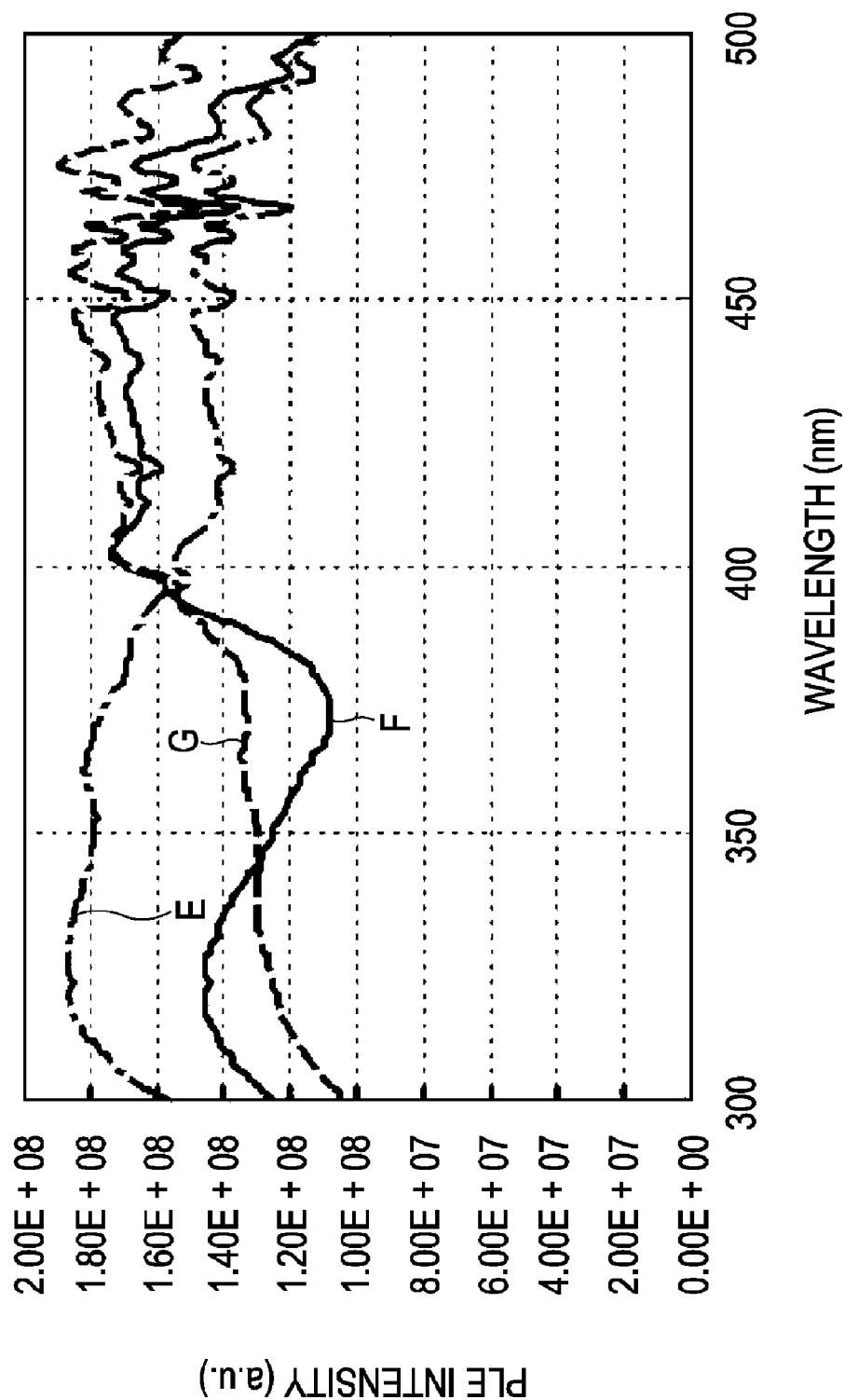
FIG. 3 is a spectral diagram showing the relationship between the composition ratio and the absorption wavelength range in an example of a phosphor according to an embodiment of the present invention.

Furthermore, in the composition represented by chemical formula 9 (corresponding to Example 1), which is a typical composition among the compositions represented by chemical formula 8, the relationship between the absorption wavelength range and the luminescent intensity was examined for various measured composition ratios, that is, various values a. As shown in FIG. 3, a main absorption wavelength range changed in accordance with the composition ratio, and thus the luminescent intensity in each absorption wavelength range changed. In the excitation spectra shown in FIG. 3, the chain line E, the continuous line F, and the broken line G represent the measurement results of samples 2, 3, and 4 in Example 1, respectively.

As shown in FIG. 3, in the phosphor of sample 2 (chain line E), when the wavelength range of the irradiating light is a first wavelength range, which lies at the shorter wavelength side of a reference wavelength range having a wavelength of 380 nm to 400 nm, the luminescent intensity is higher than that in the case where the wavelength range of the irradiating light is a second wavelength range, which lies at the longer wavelength side of the reference wavelength range. In contrast, in sample 3 (continuous line F) and sample 4 (broken line G), when the wavelength range of the irradiating light is the second wavelength range, which lies at the longer wavelength side of the reference wavelength range, the luminescent intensity is relatively high. In particular, sample 4 (broken line G) shows higher luminescent intensity when the wavelength range of the irradiating light is the second wavelength range. Thus, a composition ratio of Sr:Ga suitable for the excitation in the visible light range of 380 nm to 780 nm (in particular, a center wavelength of 400 nm or more) and a composition ratio of Sr:Ga suitable for the excitation in the ultraviolet light range and an electron beam range of 100 pm to 400 nm (in particular, a center wavelength of 380 nm or less) were confirmed. Therefore, according to the phosphor of the present embodiment, by adjusting the stoichiometry of Ga, the excitation of a green phosphor can be performed by selecting the irradiating light of a desired wavelength region.

Although not shown in the figure, in order to increase the luminescent intensity, the Eu concentration is particularly preferably 3 to 7 mole percent. The reason for this is follows. Since Eu functions as the luminescence center, an excessively low Eu concentration decreases the luminescent intensity. On the other hand, an excessively high Eu concentration also decreases the luminescent intensity because of a phenomenon known as concentration quenching. Accordingly, in determining the composition, when the Eu concentration is further decreased, the concentration is preferably in the range of 1 mole percent or more, and when the Eu concentration is further increased, the concentration is preferably in the range of 9 mole percent or less. Furthermore, in the systems containing barium or calcium, which correspond to Examples 2 or 3, respectively, the excitation spectra showed the same tendency as that of the system containing only strontium shown in FIG. 3.

In the above embodiments of the phosphors, although the Ga content was twice the Sr content in terms of the stoichiometric ratio in the preparation of the precursor formulation, a Ga content about four times the Sr content was detected as the measured value of the samples. Although the details of the crystal structure have not yet been confirmed, it is believed that Sr may not be incorporated in the crystal structure. In addition, regarding samples having a high Ga content, it is difficult to remove Ga that does not constitute the crystal structure by purification. It is also difficult to separately detect only Ga constituting the crystal structure by ICP-AES without detecting other Ga. Therefore, specifically, Ga that does not constitute the crystal structure may also be detected in the measurement of the composition ratio as an excess of Ga.

However, for example, although a thiogallate phosphor in which the stoichiometric ratio of Sr is 1 is also described as $SrGa_2S_4$:Eu, a product whose stoichiometric ratio of Ga is increased or decreased may be actually synthesized because of various factors during the synthesizing process. In addition, in ZnO:Zn, which is generally known as a phosphor, the stoichiometric ratio of Zn to O is not always 1:1 because defects of oxygen cause emission. Accordingly, it is believed that the relationship between Ga and the crystal structure does also not always need quantitative exactitude (see, Phosphor Handbook, edited by Keikotai Dogakkai (Phosphor Research Society), Ohmsha Ltd., p. 157).

According to the description in a paper by C. Chartier, C. Barthou, P. Benalloul, and J. M. Frigerio in the Journal of Luminescence, Vol. 111, pp. 147-148 (2005), the shape of the excitation spectrum relates to the crystal structure, and depends on the symmetry of the crystal. The crystal structure of this phosphor has D4d symmetry, and the 5d orbital of $Eu^{2+}$ is split by this symmetry. In addition, the split represented by $4f^7 \rightarrow 4f^6 5d^1$ of $Eu^{2+}$ contributes to the emission, and the orbital splits into energy states e2 and a1 by the symmetry. However, this document does not describe the dependency of the crystal structure on the excitation spectral intensity. The fact that the shape of the excitation spectrum changes in accordance with the amount of Ga present was found in the present invention for the first time. The effect of the change in the amount of Ga on the symmetry of the crystal structure will be examined by a crystallographic consideration. However, from a phenomenological standpoint, it is believed that, in the D4d symmetry of $(Sr_{(1-x-y)}Ca_xBa_y)Ga_{(x)}S_4$:Eu, the splitting of the 5d orbital changes in accordance with the amount of Ga, resulting in the change in the ratio of the energy state e2 to the energy state a1.

An embodiment of an optical device according to the present invention will be described. The optical device according to this embodiment can constitute display devices such as a Braun tube and a field emission display. In a monochromatic or color Braun tube (known as cathode-ray tube), a vacuum tube body at least includes an electron gun and a phosphor screen facing the electron gun. A green phosphor layer constituting the phosphor screen includes the above-described phosphor of an embodiment of the present invention, the phosphor performing emission by means of an electron beam excitation. In the field emission display, a flat vacuum container at least includes an electron emission unit, an electron control unit that controls electrons emitted from the electron emission unit, and a phosphor screen. A green phosphor layer constituting the phosphor screen includes the above-described phosphor of an embodiment of the present invention, the phosphor performing emission by means of an electron beam excitation. In this embodiment, description will be made of an emission unit structure, such as a white light-emitting diode (LED) in which a phosphor is excited by a blue LED or a white LED in which a phosphor is excited by an ultraviolet LED, which is a main structural unit of such optical devices.

Figure 4:
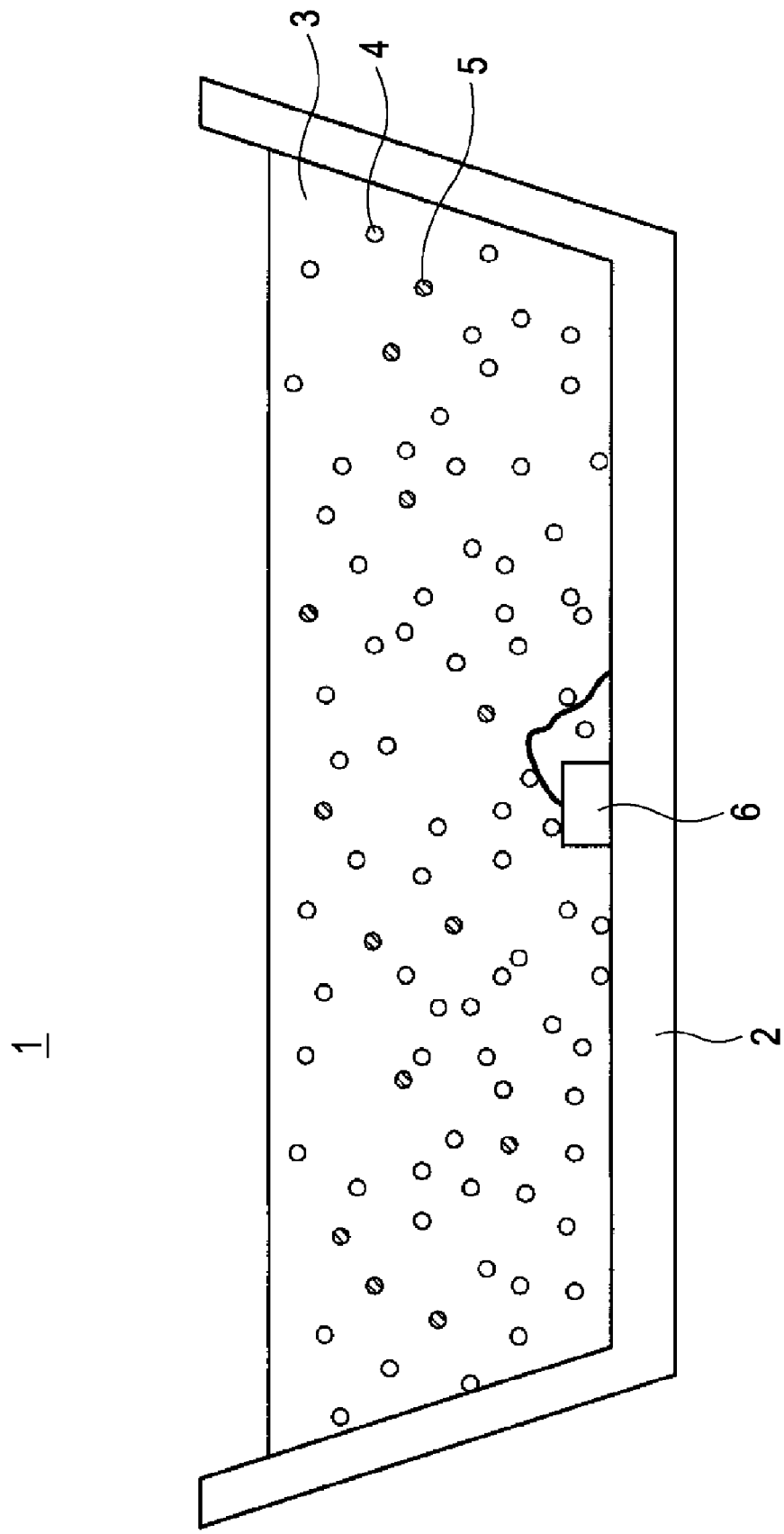
FIG. 4 is a schematic cross-sectional view showing an example of an optical device according to an embodiment of the present invention.

As shown in FIG. 4, an optical device 1 of this embodiment includes at least an emission unit. In the emission unit, a filler 3 composed of a resin or the like is disposed in a casing 2 composed of, for example, a white acrylic resin. First phosphor particles 4 composed of the phosphor according to the above embodiment and second phosphor particles 5 composed of another phosphor are dispersed in the filler 3. The first phosphor particles 4 and the second phosphor particles 5 are excited by a first light source 6 such as an LED and emit fluorescence. Instead of the acrylic resin, polycarbonate, polyvinyl chloride, or the like may be used as the material of the casing 2. In particular, the casing 2 is preferably composed of, for example, a white material having a high light reflection efficiency.

A phosphor having a composition represented by chemical formula 12, which corresponds to Example 1 in the above embodiment, was used as the phosphor serving as a main component of the first phosphor particles 4.

$SrGa_3S_4$:Eu  [Chemical formula 12]

Specifically, a phosphor having a value of a of about 2 and an excess of Ga, wherein a total amount of Ga includes the Ga in the phosphor composition and the excess of Ga, and a ratio of the total amount of Ga to a total amount of Sr in the composition is 4.23, which was confirmed to be the optimum value in the range of 2.8 to 5.9, was dispersed in an amount of 4 weight percent in the filler 3 (resin). The mixture was applied onto the surface of the first light source 6, i.e., a blue LED, and the luminance was measured. As a result, in the entire part of the optical device 1, a blue-green emission was observed and the luminance was higher than that of the cases using known phosphors. The luminance was increased by 10%, 18%, and 18% compared with the cases where the emission unit was prepared using the phosphors of Comparative Examples 1, 2, and 3, respectively, described above. This result shows that the phosphor according to an embodiment of the present invention can provide the optical device 1 with excellent characteristics compared with the known phosphors.

Examples of the second phosphor particles 5 include typical phosphors such as CaS:Eu and CaSrS:Eu, and red phosphors such as nitride phosphors and oxynitride phosphors described in the Journal of Luminescence, Vol. 111, pp. 139-145 (2005) and 305th Keikotai Dogakkai Koen Yoko (Preprints of meeting, Phosphor Research Society), Nov. 26, 2004. For example, when the second phosphor particles 5 generate white light using blue light emitted from the first light source 6 as the excitation light together with the first phosphor particles 4, the luminous efficiency can be increased. In addition, as in the above-described embodiment of the phosphor, by appropriately selecting the measured composition ratio of the phosphor serving as the main component of the first phosphor particles 4, the luminance and the luminescent intensity can be improved in both cases where the wavelength range of the excitation light emitted from the first light source 6 is the visible range and where the wavelength range thereof is the ultraviolet range.

As described above, according to the phosphor of an embodiment of the present invention, the luminance of a thiogallate green phosphor can be improved without degrading the color purity. Hitherto, when a phosphor has a composition in which the area of the emission spectrum thereof is increased in order to improve the luminance, the color purity may be degraded. In contrast, in the phosphor of an embodiment of the present invention, a composition ratio (for example, the ratio of Ga) that provides particularly high excitation intensity is selected in accordance with the excitation wavelength, thereby improving the luminance and maintaining and improving the color purity. An embodiment of the present invention can also provide emission devices such as an emission unit and an optical unit that include this phosphor.

Although a composition in which a Ga composition ratio in the stoichiometric ratio (the above-described value a) is 2 is included as the composition of the phosphor according to the above embodiment of the present invention, there is a difference in characteristics between this phosphor and phosphors of comparative examples (having known compositions). Although conditions (the time, the temperature, etc.) for drying, firing, and the like in the synthesizing process of the phosphor may slightly affect the difference in characteristics, it is believed that the main reason for the difference is that the concentration of Eu has been increased, and in addition, value a and the amount of excess Ga have been appropriately selected. In known phosphors, in particular, in known thiogallate phosphors, Eu serving as the luminescence center is generally added in a small content of 100 ppm to 0.5 mole percent in the synthesis. Considering the examination results of the phosphor according to an embodiment of the present invention, it is believed that the improvement in the luminance due to the selection of an appropriate value a and the amount of excess Ga can be achieved by increasing the concentration (amount added) of Eu.

Figure 5:
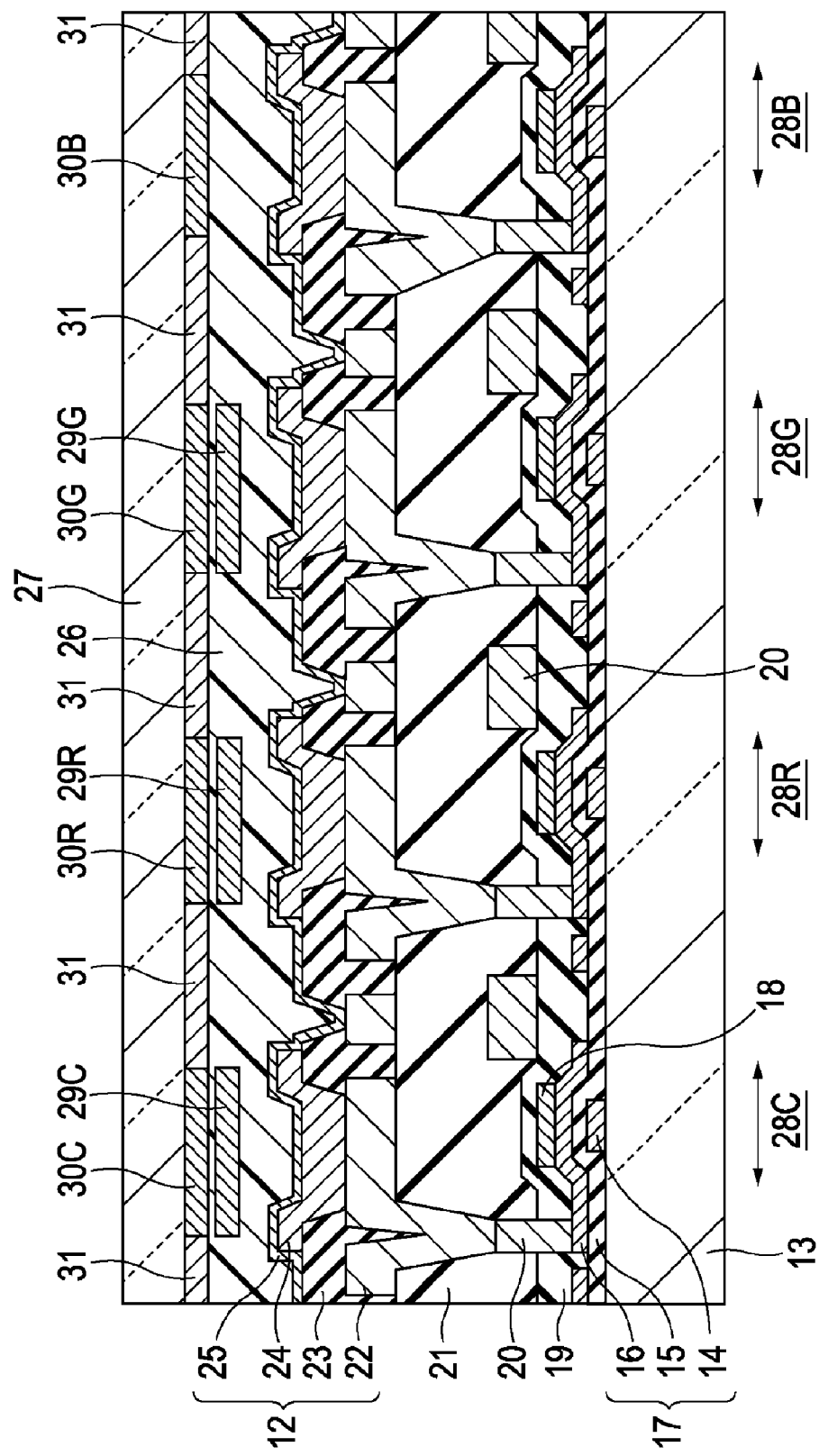
FIG. 5 is a schematic cross-sectional view showing an example of a display device according to an embodiment of the present invention.

Embodiments of a display device according to the present invention will be described. FIG. 5 is a schematic cross-sectional view of a display device according to an embodiment of the present invention.

As shown in FIG. 5, a display device 11 according to this embodiment includes an organic electroluminescent (EL) element 12. For example, a thin film transistor (TFT) element 17 including a wiring 14, a gate insulating film 15, and a semiconductor thin-film 16 is provided on a glass substrate 13 for each pixel. A wiring 20 is provided on the TFT element 17, with a channel protective film 18 and an insulating film 19 provided therebetween. A first electrode 22 is provided as a positive electrode on a planarizing insulating film 21 that fills the gaps between each wiring 20 to planarize the upper part of the TFT element 17. The first electrode 22 is electrically connected to the TFT element 17 via a corresponding wiring 20, thereby forming an active matrix structure driven by the TFT element 17.

The first electrode 22 is separated by an interlayer insulating film 23 to form each pixel. An organic layer 24 composed of an organic luminescent material, which will be described below, is provided for each pixel on the first electrode 22 exposed on an opening of the interlayer insulating film 23. A second electrode 25 serving as a negative electrode is provided on each organic layer 24 so as to face the first electrode 22. The second electrode 25 is common to a plurality of pixels and is provided, for example, over the entire area. The second electrode 25 is connected to some of the plurality of wirings 20 that are provided for individual pixels and that are not connected to the first electrode 22 via internal wiring (not shown in the figure). Furthermore, for example, when the second electrode 25 is formed so as to have a sufficiently small thickness, the display device 11 can have a top emission structure in which the emission from the organic layer 24 is taken from the side of the second electrode 25. In this structure, light having, for example, a wavelength range of 380 to 780 nm (visible light range) is emitted from the organic layer 24. In particular, in this embodiment, light in the blue region having a wavelength range of 450 to 470 nm is emitted.

A resin layer 26 is provided on the second electrode 25 that is common to a plurality of pixels, for example, so as to cover the entire surface. Color conversion layers corresponding to a target color for each pixel are provided in the resin layer 26 according to need. Specifically, for example, in a pixel 28B corresponding to blue (B), no color conversion layer is provided. In pixels 28R, 28G, and 28C corresponding to red (R), green (G), and light blue (cyan: C), color conversion layers 29R, 29G, and 29C are provided, respectively. In the pixels 28R, 28G, 28B, and 28C corresponding to the colors, color filters 30R, 30G, 30B, and 30C for corresponding pixels may be provided on the resin layer 26 including the color conversion layers. A black matrix 31 that at least optically separates the color filters is provided between the color filters. A sealing substrate 27 composed of, for example, glass is provided on the entire surface to form the display device 11. In an organic EL element, a luminance proportional to the current density supplied to the element is generally obtained. In the display device of this embodiment, regarding the light output through the color filter 30B in the pixel 28B corresponding to the blue light emission, when the chromaticity was adjusted to (0.15, 0.070) and a current was supplied corresponding to a voltage of 8.5 V and a current density of 10 $mA/cm^2$, the luminance was 90 $cd/m^2$. Furthermore, when continuous emission was performed with a luminance of 450 $cd/m^2$ while a current was supplied to this element with a current density of 50 $mA/cm^2$, the luminance half-life was about 350 hours.

In the display device of this embodiment, the color conversion layer 29G corresponding to green includes the phosphor according to an embodiment of the present invention. Therefore, the color conversion layer can be formed using an inorganic phosphor having a high durability. In addition, a display device including an inorganic phosphor having an improved luminance, color purity, and the like compared with known phosphors can be provided. According to the phosphor of an embodiment of the present invention, by appropriately selecting the composition, the color conversion layer 29C corresponding to a light blue pixel can also be formed and high luminance and a high color purity can be achieved.

As Example 1 of display devices of this embodiment, measurement results of the luminescent intensity of display devices each including a color conversion layer 29G composed of a material having a composition represented by chemical formula 13 will be described with reference to Table 7. In this experiment, the luminescent intensity of the green output light in the pixel 28G was measured under the condition that the current density of the current supplied to the organic layer 24 of the organic EL element was 10 $mA/cm^2$.

$SrGa_aS_4:Eu$ [Chemical formula 13]

This is an example in which x=y=0 and m=n=0 in the composition represented by chemical formula 8. The color conversion layer 29G was prepared by dispersing a phosphor having a composition represented by chemical formula 13 in an amount of 30 weight percent into an epoxy resin serving as a resin for dispersion, and forming the resin so as to have a thickness of 50 μm.

In Example 1, when visible light was used as the excitation light of the phosphors, as shown in Table 7, as the stoichiometric ratio (Ga/Sr) of Ga to Sr in the preparation of the formulation (i.e., in the raw material) increased, the measured composition ratio of Ga/Sr in the sample also tended to increase. However, regarding the luminescent intensity ratio, only the luminance of samples 3, 4, and 5 wherein the measured composition ratios corresponding to value a in chemical formula 13 and an excess of Ga were 4.23, 5.71, and 6.31, respectively, was equal to or larger than that of Comparative Examples 1 to 3, which had a known composition $SrGa_2S_4$:Eu.

TABLE 7

| | Sample 1 | Sample 2 | Sample 3 | Sample 4 | Sample 5 | Comparative Example 1 | Comparative Example 2 | Comparative Example 3 |
|---|---|---|---|---|---|---|---|---|
| Ga/Sr in sample (Measured ratio) | 1.87 | 2.12 | 4.23 | 5.71 | 6.31 | 2.27 | 1.85 | 1.83 |
| Luminescent intensity ratio (%) | 76% | 95% | 145% | 125% | 110% | 100% | 75% | 73% |

Figure 6:
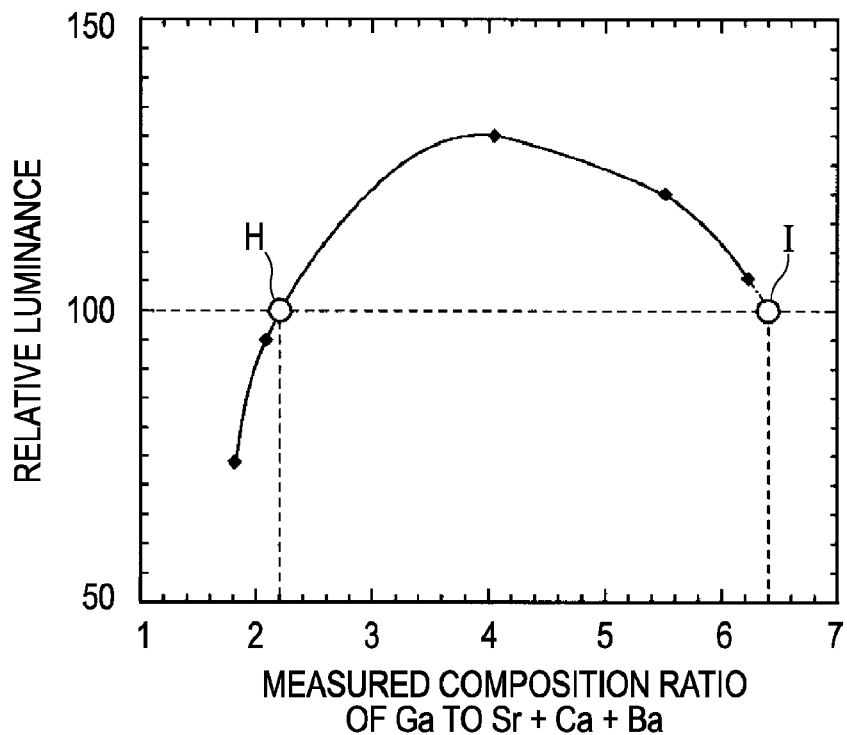
FIG. 6 is a graph showing the relationship between the composition ratio and the relative luminance of a phosphor in an example of a display device according to an embodiment of the present invention.

FIG. 6 shows a graph summarizing the measurement results. It is believed that a luminance relatively higher than that of the above comparative examples, i.e., known examples, can be achieved in the range of 2.2 (point H in the figure) to 6.4 (point I in the figure) of the measured composition ratio. The optimum value of the measured composition ratio was 4.00.

In this experiment, a luminescent intensity higher than that of phosphors of known compositions was obtained over a wider range of the measured composition ratio compared with the case of Example 1 in the above-described embodiment of the phosphor. It is believed that the shapes and the positional relationships of the color conversion layer 29G in which the phosphor is dispersed and the organic EL element 12 are appropriately selected, and thus the luminescent intensity can be improved.

As Example 2 of display devices of this embodiment, measurement results of the luminescent intensity of display devices each including a color conversion layer 29C composed of a material having a composition represented by chemical formula 14 will be described with reference to Table 8. In this experiment, the luminescent intensity of the cyan output light in the pixel 28C was measured under the condition that the current density of the current supplied to the organic layer 24 of the organic EL element was 10 mA/cm².

$$BaGa_aS_4:Eu \qquad \text{[Chemical formula 14]}$$

This is an example in which x=0, y=1, and m=n=0 in the composition represented by chemical formula 8. The color conversion layer 29C was prepared by dispersing a phosphor having a composition represented by chemical formula 14 in an amount of 30 weight percent into an epoxy resin serving as a resin for dispersion, and forming the resin so as to have a thickness of 50 μm.

In Example 2, when visible light was used as the excitation light of the phosphors, as shown in Table 8, as the stoichiometric ratio (Ga/Ba) of Ga to Ba in the preparation of the formulation (i.e., in the raw material) increased, the measured composition ratio of Ga/Ba in the sample also tended to increase. However, regarding the luminescent intensity ratio, only the luminance of samples 3, 4, and 5 wherein the measured composition ratios corresponding to value a in chemical formula 14 and an excess of Ga were 4.05, 5.51, and 6.21, respectively, was equal to or larger than that of Comparative Examples 1 to 3, which had a known composition $BaGa_2S_4$:Eu.

Figure 7:
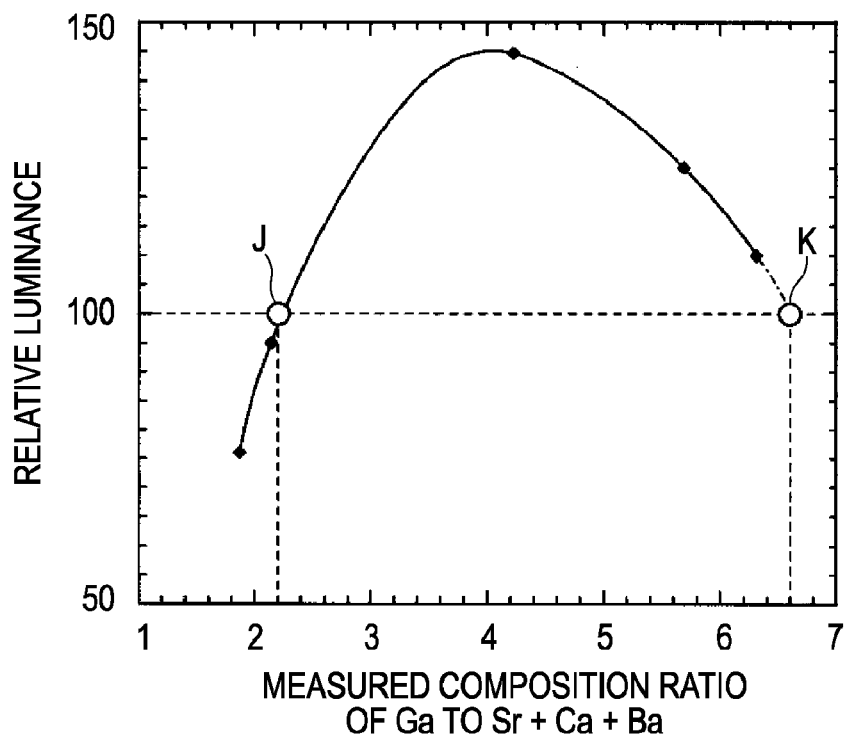
FIG. 7 is a graph showing the relationship between the composition ratio and the relative luminance of a phosphor in an example of a display device according to an embodiment of the present invention.

FIG. 7 shows a graph summarizing the measurement results. It is believed that a luminance relatively higher than that of the above comparative examples, i.e., known examples, can be achieved in the range of 2.2 (point J in the figure) to 6.6 (point K in the figure) of the measured composition ratio. The optimum value of the measured composition ratio was 4.00.

emission center wavelength, the main emission wavelength range, and the main absorption wavelength range can be selected within a composition range in which the luminescent intensity is improved compared with that of known phosphors. In the phosphor of the color conversion layer 29C constituting the pixel 28C of the display device of this embodiment, these factors can be similarly selected by controlling the amount of barium contained in the form of a solid solution.

An example of a method of producing the above-described display device 11 will now be described with reference to FIGS. 8A, 8B, 9A, and 9B. First, as shown in FIG. 8A, a wiring 14, a gate insulating film 15, and a semiconductor thin-film 16 are formed on a substrate 13 composed of, for example, glass for each pixel 28 so as to correspond with the structure of a TFT element 17. A channel protective film 18 is then formed on the central part of the semiconductor thin-film 16, which corresponds to the gate wiring 14. An impurity is selectively doped in both ends of the semiconductor thin-film 16, which do not have the channel protective film 18 thereon. Thus, the TFT element 17 having a source and a drain is prepared. Subsequently, an insulating film 19 is formed so as to cover the TFT element 17 and the channel protective film 18. A wiring 20 that is composed of, for example, aluminum and that is connected to the drain of the TFT element 17 via internal wiring (not shown in the figure) is formed on the insulating film 19. In this embodiment, as shown in the schematic cross-sectional view in FIG. 8A, two wirings 20 are formed for each pixel corresponding to a first electrode and a second electrode to be formed.

Subsequently, as shown in FIG. 8B, a planarizing insulating film 21 is formed on the insulating film 19 so as to fill the gaps between each wiring 20. Openings of the planarizing insulating film 21 are formed at positions corresponding to the wirings 20, thereby exposing the upper surface of the wirings 20. Although not shown in the figure, in order to contact a second electrode described below with the wiring 20 that is provided so as to correspond with the second electrode, openings of the planarizing insulating film 21 are also preferably formed on the wirings 20 corresponding to the second electrode. The openings are preferably filled with the first electrode formed thereafter or another conductive member. Subsequently, a first electrode 22 composed of a laminated film including a chromium (Cr) film with a thickness of 50 nm

TABLE 8

| | Sample 1 | Sample 2 | Sample 3 | Sample 4 | Sample 5 | Comparative Example 1 | Comparative Example 2 | Comparative Example 3 |
|---|---|---|---|---|---|---|---|---|
| Ga/Ba in sample (Measured ratio) | 1.81 | 2.05 | 4.05 | 5.51 | 6.21 | 2.12 | 1.85 | 1.75 |
| Luminescent intensity ratio (%) | 74% | 95% | 130% | 120% | 105% | 100% | 75% | 73% |

As in this example, in phosphors containing barium (Ba) as a main component rather than strontium (Sr), the emission wavelength is shifted to the shorter wavelength side compared with that of the system containing only strontium. In this case, the output light shows, for example, cyan, which has an emission center wavelength of 505 nm. In the phosphor according to an embodiment of the present invention, the and indium tin oxide (ITO) film is formed by DC magnetron sputtering so as to have a thickness of, for example, 100 nm. The deposition is performed using Ar as a sputtering gas, at a pressure of 0.3 Pa, and with a DC output of 150 W while 1% $O_2$/Ar gas is supplied at a rate of 5 sccm. In order to clean the surface of the first electrode 22, an oxygen plasma treatment is performed.

Subsequently, the first electrode 22 is removed by etching using a known lithography technology so that at least a part constituting the pixels remains. An interlayer insulating film 23 composed of, for example, $SiO_2$ is formed over the openings formed by the etching and the upper surface of the first electrode 22 so as to have a thickness of 600 nm. Furthermore, a part of the interlayer insulating film 23, the part corresponding to the pixel-forming part of the first electrode 22, is removed by etching to expose the first electrode 22. An organic layer 24 is formed on the first electrode 22 by vapor deposition. Specifically, organic substances (each 0.2 g) are placed in boats for resistance heating, and the boats are attached to predetermined electrodes of a vacuum evaporation system. The pressure of a vacuum tank is reduced to $1.0\times10^{-4}$ Pa, a voltage is then applied to each boat, and the boats are sequentially heated to perform vapor deposition. Thus, the following films are sequentially formed on the surface of the first electrode 22. For example, a 4,4',4''-tris(3-methylphenylphenylamino)triphenylamine (m-MTDATA) film with a thickness of 20 nm is formed as a hole-injecting layer, a bis[(N-naphthyl)-N-phenyl]benzidine ($\alpha$-NPD) film with a thickness of 30 nm is formed as a hole transport layer, a blue light emitting layer (EML) with a thickness of 55 nm that serves as a host and that is composed of 4,4-bis(2,2-diphenylvinyl)biphenyl (DPVBi) that contains 5% of 4,4-bis (3-carbazolylvinyl)biphenyl (BCzVBi) as blue emission species serving as a dopant is formed, an 8-hydroxyquinoline aluminum (Alq3) film with a thickness of 10 nm is formed as an electron transport layer, a LiF layer with a thickness of 0.3 nm is formed as an electron-injecting layer, and a MgAg film with a thickness of 1 nm is then formed, thereby forming the organic layer 24.

Figure 9A:
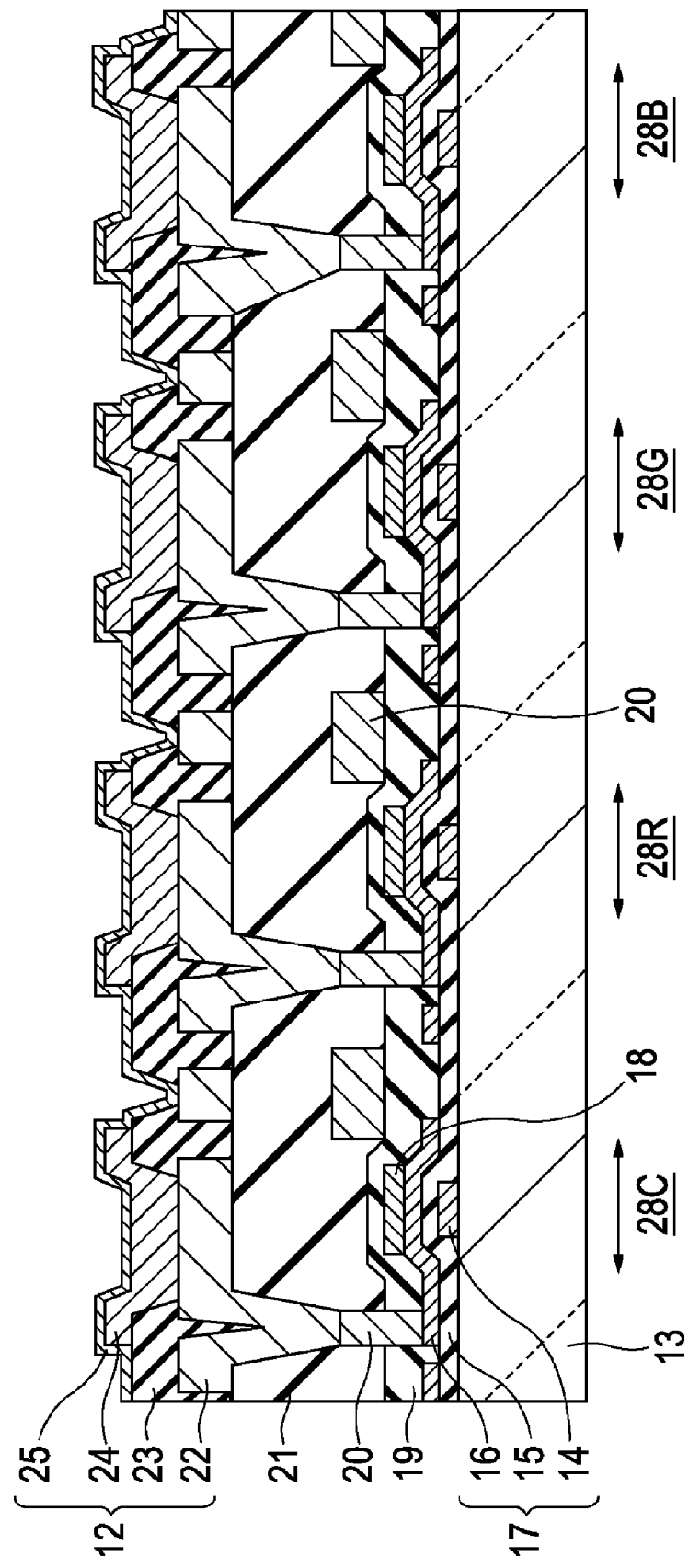
FIGS. 9A and 9B are views showing steps of producing the display device according to an embodiment of the present invention.

Subsequently, as shown in FIG. 9A, the second electrode 25 composed of ITO or the like is formed by DC magnetron sputtering on the organic layer 24, for example, on the entire surface of the organic layer 24. Thus, a laminated structure, which is a main part of the final organic EL element, is formed. Specifically, a target of ($In_2O_3$+10 wt % $SnO_2$) is placed in a vacuum chamber, and the substrate is placed at a facing position. The deposition is performed at a pressure of 0.3 Pa while about 40 sccm of 1% $O_2$/Ar gas is introduced. The deposition is performed by DC discharge at 200 W for 10 minutes, and the thickness of the deposited film is 100 nm.

Figure 9B:
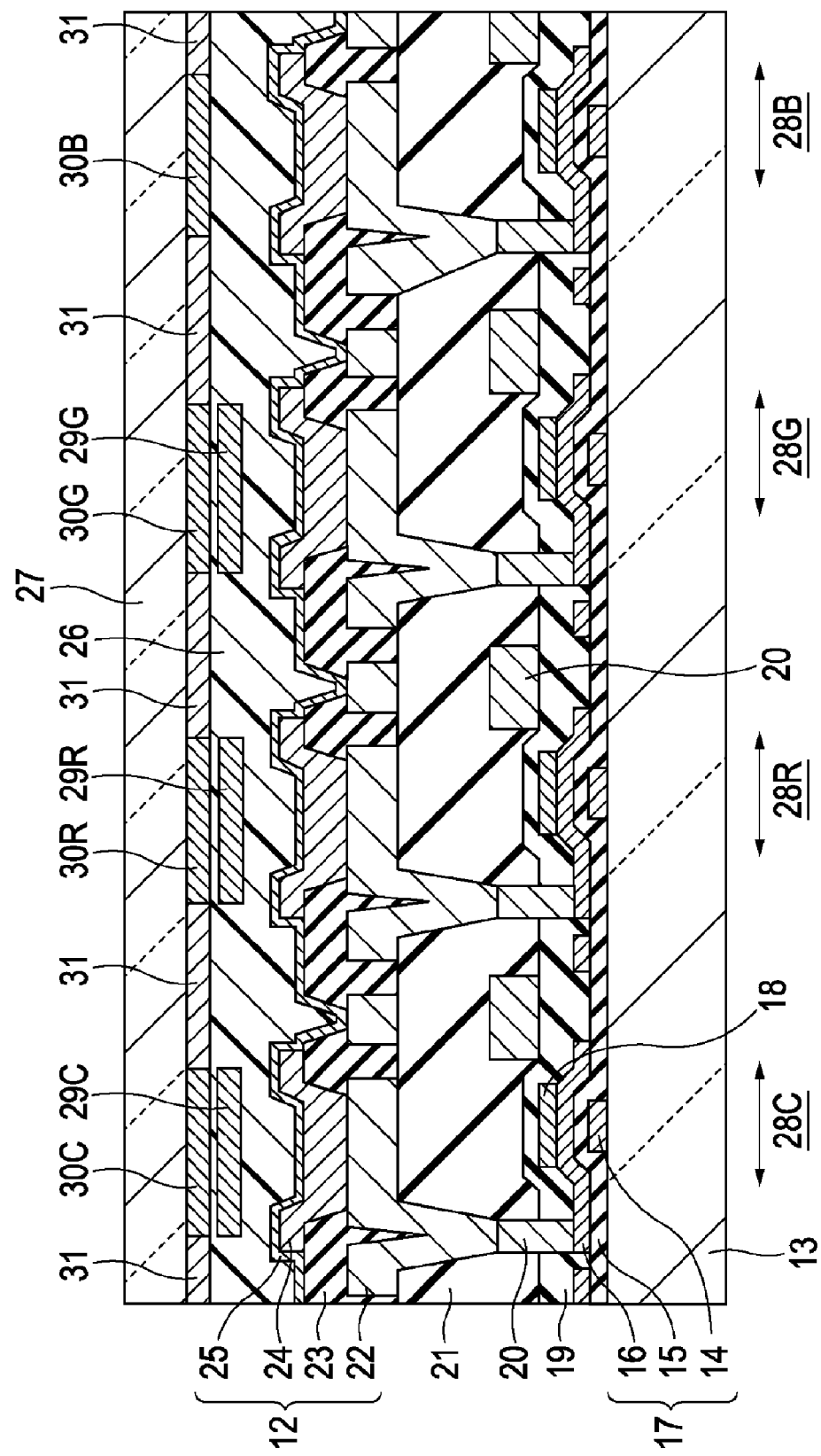

Subsequently, in addition to the substrate 13, a glass plate, which functions as a sealing substrate of the display device, is separately prepared. On the glass plate, color filters 29R, 29G, 29B, and 29C are formed at the positions of the corresponding pixels and a black matrix 31 is formed therebetween. A resin layer 26 is formed on the entire surface thereof. The resin layer 26 includes color conversion layers 29R, 29G, and 29C each containing a phosphor at positions corresponding to the RGC pixels. The substrate 13 faces the sealing substrate (glass plate) 27 so that the resin layer 26 and the second electrode 25 are in contact with each other, that is, so that the organic EL element 12 and the color conversion layers 29R, 29G, and 29C are disposed therebetween, and then bonded with each other. Thus, as shown in FIG. 9B, the display device 11 of this embodiment is produced.

Embodiments of the phosphor, the optical device, and a display device of the present invention have been described. The materials used and the numerical conditions such as the amounts of the materials, the processing time, and the dimensions in the description are preferred examples. In addition, the dimensions, the shape, and the arrangement in the drawings used in the description also show outlines. That is, the present invention is not limited to the embodiments. For example, instead of Eu, lanthanoids such as cerium (Ce) can be used as the emission center of the phosphor according to an embodiment of the present invention.

Instead of ultraviolet light, for example, an electron beam having a wavelength of 100 pm to 10 nm can be used. In the electron beam excitation, the excitation energy is higher than that in the ultraviolet excitation, and the electron beam excitation generally shows a tendency similar to that in the ultraviolet excitation. Therefore, it is believed that an emission device including an electron beam source instead of the above-described first light source can also have a structure including a phosphor whose concentration range of Ga, i.e., whose measured composition ratio of Ga is the same as that in the case of the ultraviolet excitation.

In the above embodiment of the display device, an example in which the resin layer 26 is provided directly on the second electrode 25 has been described. Alternatively, for example, an auxiliary electrode composed of a transparent conductive material may be provided between the resin layer 26 and the second electrode 25 so as to cover a plurality of pixels, for example, so as to cover the entire surface. In the description of the above embodiment, the display device including an organic EL element has a top emission structure and is driven by an active matrix. However, the display device according to an embodiment of the present invention is not limited thereto. The display device may have a bottom emission structure and may be driven by a passive matrix.

For example, the optical device and the display device according to embodiments of the present invention can constitute not only a display device but also electronic equipment such as an imaging device. In the description of the above-described embodiment, the display device includes a pixel corresponding to light blue (C) light emission in addition to a pixel corresponding to red (R) light emission, a pixel corresponding to green (G) light emission, and a pixel corresponding to blue (B) light emission. Alternatively, the display device according to an embodiment of the present invention may include a pixel corresponding to violet (magenta: M) light emission or yellow (Y) light emission. The pixel structure can be selected according to a desired color reproducing range. Thus, various modifications and changes may be made in the present invention.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A phosphor comprising:
a composition represented by chemical formula 1:

$(Sr_{(1-x-y)}Ca_xBa_y)D_aS_4$:Eu, where D is $(Ga_{(1-m-n)}Al_mIn_n)$     Chemical formula 1 wherein a concentration of europium (Eu) ranges from 1 to 9 mole percent,
$0\leq x\leq 1$, $0\leq y\leq 1$, and $x+y\leq 1$,
$0\leq m\leq 1$, $0\leq n\leq 1$, and $m+n\leq 1$, and
a is about 2; and
an excess of D, where any Ga, Al and In existing in the excess of D is in non-elemental form, wherein a total amount of D includes the D in the composition and the excess of D, and a ratio of the total amount of D to a total amount of (Sr+Ca+Ba) in the composition ranges from 2.8 to 5.9, and wherein a main absorption wavelength range of the excitation is any one of a first wavelength range that overlaps an entirety of a reference wavelength range ranging from 380 to 400 nm and extends to a shorter wavelength side and a second wavelength range that overlaps an entirety of the reference wavelength range and extends to a longer wavelength side according to the value a.

2. The phosphor according to claim 1, the first wavelength range includes at least an ultraviolet light range and an electron beam ranging from 380 nm or less, and the second wavelength range includes at least a visible light ranging from 400 nm or more.

3. The phosphor according to claim 1, wherein the concentration of Eu ranges from 3 to 7 mole percent.

4. An optical device comprising:

a phosphor including a composition represented by chemical formula 2:

$(Sr_{(1-x-y)}Ca_xBa_y)D_aS_4$:Eu, where D is $(Ga_{(1-m-n)}Al_mIn_n)$  Chemical formula 2 wherein a concentration of Eu ranges from 1 to 9 mole percent, $0 \leq x \leq 1$, $0 \leq y \leq 1$, and $x+y \leq 1$, $0 \leq m \leq 1$, $0 \leq n \leq 1$, and $m+n \leq 1$, and a is about 2, and an excess of D, where any Ga, Al and In existing in the excess of D is in non-elemental form, wherein a total amount of D includes the D in the composition and the excess of D, and a ratio of the total amount of D to a total amount of (Sr+Ca+Ba) in the composition ranges from 2.8 to 5.9.

5. The optical device according to claim 4, wherein a main absorption wavelength range of the excitation of the phosphor is a wavelength range that overlaps an entirety of a reference wavelength range ranging from 380 to 400 nm and extends to the longer wavelength side.

6. The optical device according to claim 4, further comprising:

a first phosphor having the composition represented by chemical formula 2;

a second phosphor having a composition different from that of the first phosphor; and a first light source serving as an excitation light source of the first and second phosphors.

7. The optical device according to claim 6, wherein a main fluorescence spectrum of the second phosphor is a red region, and the first and second phosphors and the first light source form at least a part of a light source of white light.

8. A display device comprising:

a plurality of pixels; and an organic EL element, wherein color conversion layers that convert light emitted from the organic EL element to light having a predetermined wavelength range are provided on at least a part of the pixels, and at least one of the color conversion layers includes a phosphor, the phosphor including a composition represented by chemical formula 1, $(Sr_{(1-x-y)}Ca_xBa_y)D_aS_4$:Eu, where D is $(Ga_{(1-m-n)}Al_mIn_n)$ in chemical formula 1, a concentration of Eu ranges from 1 to 9 mole percent; $0 \leq x \leq 1$, $0 \leq y \leq 1$, and $x+y \leq 1$; $0 \leq m \leq 1$, $0 \leq n \leq 1$, $m+n \leq 1$, and a is about 2, and an excess of D, where any Ga, Al and In existing in the excess of D is in non-elemental form, wherein a total amount of D includes the D in the composition and the excess of D, and a ratio of the total amount of D to a total amount of (Sr+Ca+Ba) in the composition ranges from 2.8 to 5.9, and wherein a main absorption wavelength range of the excitation is any one of a first wavelength range that overlaps an entirety of a reference wavelength range ranging from 380 to 400 nm and extends to the shorter wavelength side and a second wavelength range that overlaps an entirety of the reference wavelength range and extends to the longer wavelength side according to the value a.

9. The display device according to claim 8, wherein a main absorption wavelength range of an excitation of the phosphor is a wavelength range that overlaps an entirety of the reference wavelength range and extends to a longer wavelength side.

10. The display device according to claim 8, wherein blue light is emitted from the organic EL element.

11. The display device according to claim 8, wherein the plurality of pixels are provided so as to correspond to at least three types of light including red light, green light, and blue light.

* * * * *